(12) United States Patent  
Haner

(10) Patent No.: US 6,498,487 B1  
(45) Date of Patent: Dec. 24, 2002

(54) DISTRIBUTED CAPACITANCE INSERTS FOR NMR PROBES

(75) Inventor: Ronald L. Haner, San Francisco, CA (US)

(73) Assignee: Varian, Inc., Palo Alto, CA (US)

( * ) Notice: Subject to any disclaimer, the term of this patent is extended or adjusted under 35 U.S.C. 154(b) by 0 days.

(21) Appl. No.: 09/490,837

(22) Filed: Jan. 25, 2000

(51) Int. Cl.$^7$ .................................................. G01V 3/00
(52) U.S. Cl. ........................ 324/318; 324/309; 324/322
(58) Field of Search .............................. 324/318, 322, 324/309, 307, 300

(56) References Cited

U.S. PATENT DOCUMENTS

| | | | |
|---|---|---|---|
| 4,755,756 A | 7/1988 | Nishihara et al. | 324/322 |
| 4,851,780 A | 7/1989 | Dejon et al. | 324/322 |
| 4,929,881 A | 5/1990 | Yabusaki et al. | |
| 5,055,853 A | 10/1991 | Garnier | |
| 5,192,911 A | 3/1993 | Hill et al. | 324/322 |
| 5,262,727 A | 11/1993 | Behbin et al. | 324/318 |
| 5,594,342 A | * 1/1997 | Brey et al. | 324/322 |
| 5,619,140 A | * 4/1997 | Brey et al. | 324/318 |
| 5,929,639 A | * 7/1999 | Doty | 324/318 |
| 6,008,650 A | 12/1999 | Behbin | |
| 6,054,856 A | 4/2000 | Garroway et al. | 324/318 |

FOREIGN PATENT DOCUMENTS

WO  WO 92/17799 A1  10/1992

OTHER PUBLICATIONS

Patent abstracts of Japan entitled "Sheild Type Loop Gas Resonator", published Nov. 21, 1989, vol. 13, No. 520.

Varian nmr™ Probe brochure.

Article by Contaxes et al. entitled "High–Frequency Fields in Solenoidal Coils" published in *Journal of Applied Physics*, in Aug. 1969, vol. 40, No. 9, pp. 3548–3550.

Article by Roleson, Scott, entitled "Evaluate EMI Reduction Schemes With Shielded–loop Antennas", published in EDN, May 17, 1984, pp. 203–207.

Book by King et al., entitled "Transmission Lines Antennas and Wave Guides", Chapter II, Section 47 entitled "Unbalanced Loop Antenna–Shielding" published by Dover Publications, Inc., New York, 1965,.

* cited by examiner

*Primary Examiner*—Edward Lefkowitz  
*Assistant Examiner*—Brij B. Shrivastav  
(74) *Attorney, Agent, or Firm*—Bella Fishman; Edward H. Berkowitz

(57) ABSTRACT

Increased distributed capacitance for an NMR resonant probe coil is obtained by a surrounding conducting surface which is congruent to and spaced from the major portion of the RF current density distribution on the surface of the inductive component of the resonator. This surface is interrupted with one or more gaps to avoid or control circulating currents on the conducting surface which reflect the circulating currents of the inductive component.

15 Claims, 16 Drawing Sheets

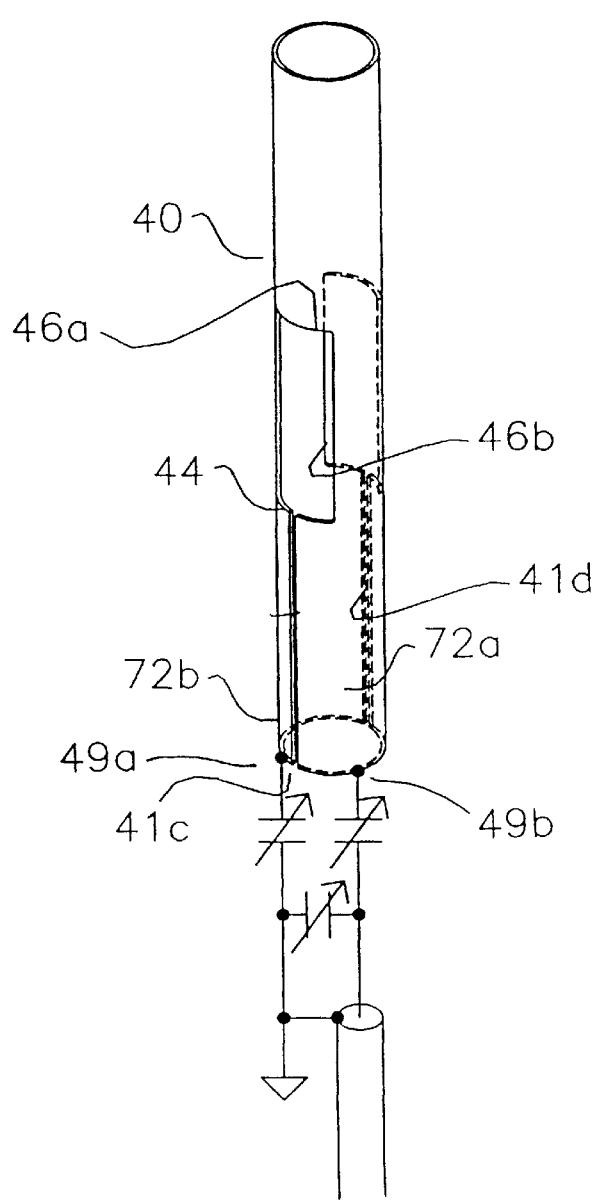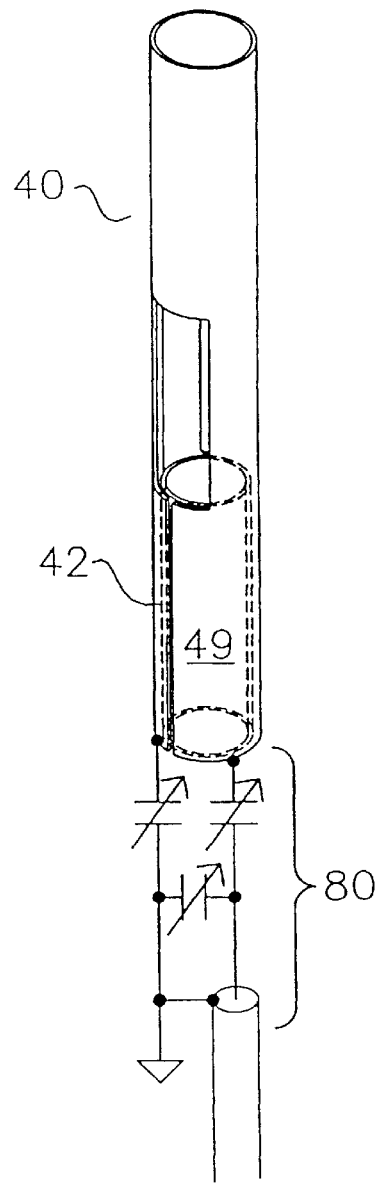
FIG. 2A
PRIOR ART
FIG. 2B
PRIOR ART

DISTRIBUTED CAPACITANCE INSERTS FOR NMR PROBES

FIELD OF THE INVENTION

The invention is in the field of nuclear magnetic resonance apparatus and methods and pertains especially to structure for RF coupling to a discrete sample.

BACKGROUND OF THE INVENTION

In the apparatus and practice of NMR measurements, particular constraints are experienced for the probe. This portion of the apparatus couples RF energy from a transmitter-modulator to a sample and from the sample to the RF receiver. The general probe structure may house a number of other functions, such as sample spinning, temperature control apparatus, RF shielding and the like. This structure is subject to constraints related to magnetic properties of the components therein, but spatial limitations remain the most critical together with optimum coupling.

For discrete samples, whether for imaging or analytic studies, the RF coupling to the sample is achieved with a resonator surrounding the sample. The resonant structure, or insert, has taken the form of an LC circuit, the inductance being furnished by a helical coil, or most commonly, as a saddle coil or birdcage resonator. Capacitance is furnished in the form of discrete chip capacitors and/or the distributed self capacitance of the inductive member. Saddle coils are most often implemented at high frequencies (proton resonances at greater than 4.6 Tesla) as a Helmholtz pair of single (or multiple) turn loops in parallel, or series, with the sample disposed therebetween. The single turn loops are most often defined on a planar conductor and then rolled into cylindrical form which may be supported by a suitable frame or may be cantilevered to surround and define the volume portion to be occupied by the sample. Self-supporting coil structures may also be formed from wire.

In addition to the conducting paths forming the saddle coil (or other resonator) there is often other related conducting structure in close proximity to the coil structure. For example, floating or non-floating RF shields are often employed to define and limit the interior volume in respect of the RF field distribution. These ordinarily take the form of cylindrical portions or closure disks coaxially mounted in respect of the coil. These floating shields are known to contribute capacitance to the proximate resonant circuit. These coaxial structures have also been implemented outside the RF coil axially spaced from the window of the RF saddle coil. Examples of such structures are found in Varian, Inc. NMR probe designated $^1H\{^{13}C/^{31}P\}$ Triple.nmr™, and also as described in U.S. Pat. No. 5,192,911 and 5,262,727, commonly assigned herewith.

In order to furnish sufficient capacitance to the LC circuit, the prior art employed an electrically floating conducting cylinder in the manner described by the above referenced U.S. Pat. No. 5,192,911 patent, often disposed surrounding and spaced from a portion of the saddle coil. This outer cylinder or band provides a distributed capacitance in combination with that proximate portion of the saddle coil. In use, this prior art outer cylinder is axially disposed away from the edge of the "window" formed by the inner bound of the loop of the saddle coil turn to avoid field distortion and at least partially for that reason the prior art is limited to a relatively small ring about the leg, or terminal region of the coil.

SUMMARY OF THE INVENTION

The present invention employs a capacitor band which matches, to a selected extent, that portion of the projected surface shape of the inductor of the resonant circuit of the probe which contain the major contribution to the RF current density. The capacitor band of the invention includes a slot to avoid completed current loops to reduce losses from inductive coupling between the coil and the capacitor band, and to distribute the image currents on the capacitor band to correspond to the real RF current distribution on the inductor.

BRIEF DESCRIPTION OF THE DRAWINGS

FIG. 2a shows a typical saddle coil of prior art.

FIG. 2b shows a saddle coil and internal RF shield of prior art.

FIG. 4b shows a capacitor band in both planar and cylindrical form for use with the coil of FIG. 4a.

FIG. 5b shows one capacitor band suitable for use with the helical coil of FIG. 5a.

FIG. 5d is a shaped capacitor band for use with the coil of FIG. 5a.

FIG. 10b is a planar capacitor band for the inductive member of FIG. 10a.

While the invention is susceptible to various modifications and alternative forms, the above figures are presented by way of example and/or for assistance to understanding the structure or phenomena. It should be understood, however, that the description herein of the specific embodiments is not intended to limit the invention to the particular forms disclosed, but rather, the intention is to cover all modifications, equivalents, and alternatives falling within the spirit and scope of the invention as defined in the appended claims.

DETAILED DESCRIPTION OF THE INVENTION

The physical context of the invention is an NMR apparatus. An idealized illustration is shown in FIG. 1.

A magnet 10 having bore 11 provides a main magnetic field. In order to control the magnetic field with precision in time and direction, there are provided magnetic field gradient coils (not shown). These are driven by gradient power supplies 16, 18 and 20, respectively. Additionally, other shimming coils (not shown) and power supplies (not shown) may be required for compensating residual undesired spatial inhomogeneities in the basic magnetic field. An object for analysis (hereafter "sample") is placed within the magnetic field in bore 11 and the sample is subject to irradiation by RF power, such that the RF magnetic field is aligned in a desired orthogonal relationship with the magnetic field in the interior of bore 11. This is accomplished through a transmitter coil 12 in the interior of bore 11. Resonant signals are induced in a receiver coil, proximate the sample within bore 11. The transmitter and receiver coils may be the identical structure, or separate structures.

Figure 1:
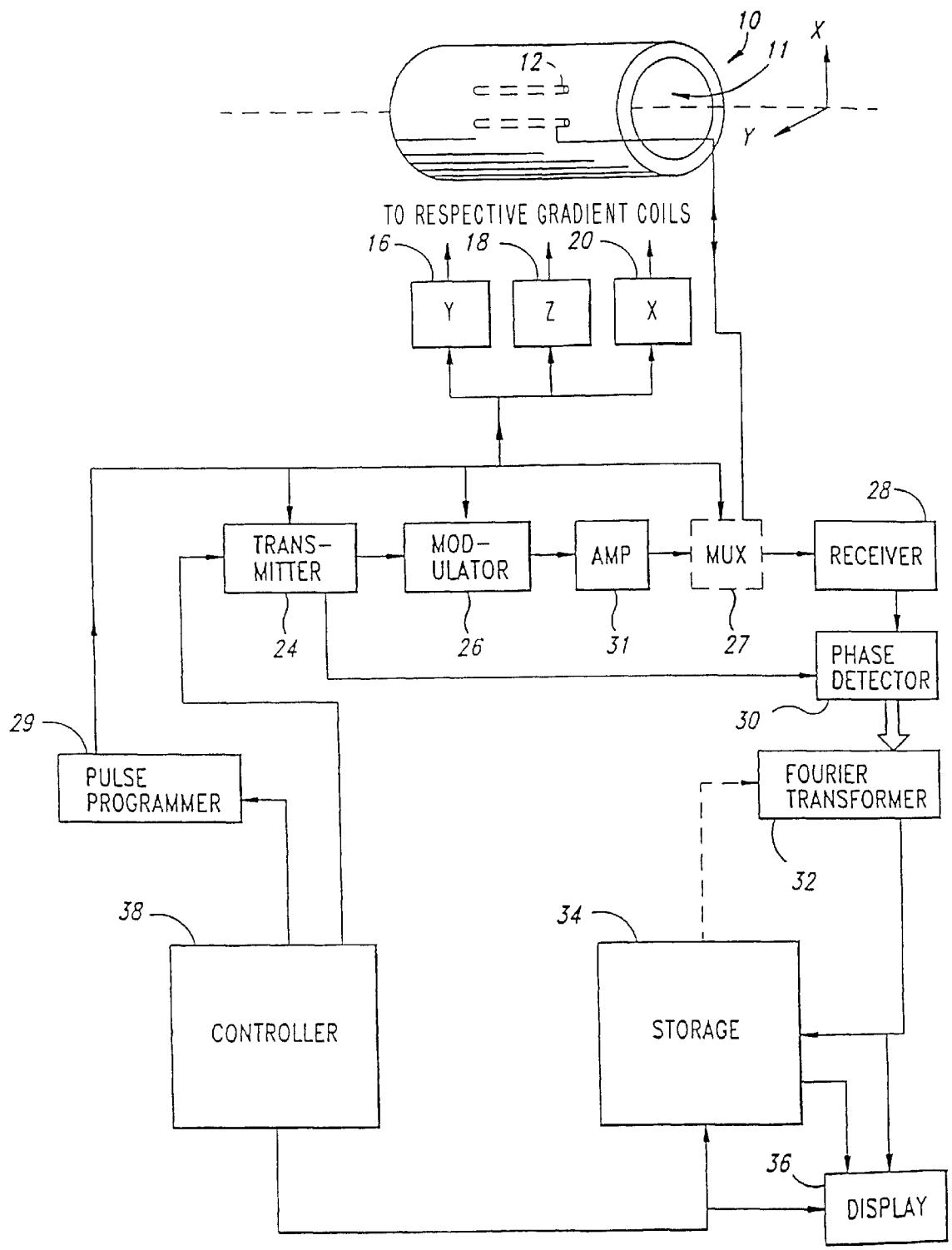
FIG. 1 is a schematic illustration of the context of the invention.

As shown in FIG. 1, RF power is provided from first transmitter 24, and is amplified by an amplifier 31 and then directed via multiplexer 27 to the RF transmitter coil 12 located within the bore 11. The transmitter 24 may be modulated in amplitude or frequency or phase or combinations thereof, either upon generation or by a modulator 26. Additional transmitter/modulator components are often employed to independently excite different gyromagnetic resonators, e.g., protons and $C^{13}$. These independent excitations are conveniently supported by a multiply resonant coil as described herein. Transmit and receive functions are not concurrently active. The identical coil may be employed for both functions if so desired. Thus, a multiplexer 27 is provided to isolate the receiver from the transmitter. In the case of separate transmitter and receiver coils, element 27, while not precisely a multiplexer, will perform a similar isolation function to control receiver operation.

The modulator 26 is controlled by pulse programmer 29 to provide RF pulses of desired amplitude, duration and phase relative to the RF carrier at pre-selected time intervals. The pulse programmer may have hardware and/or software attributes. The pulse programmer also controls the gradient power supplies 16, 18 and 20, if such gradients are required. These gradient power supplies may maintain selected static gradients in the respective gradient coils if so desired.

The transient nuclear resonance waveform is processed by receiver 28 and further resolved in phase quadrature through phase detector 30. The phase resolved time domain signals from phase detector 30 are presented to Fourier transformer 32 for transformation to the frequency domain in accordance with specific requirements of the processing. Conversion of the analog resonance signal to digital form is commonly carried out on the phase resolved signals through analog to digital converter (ADC) structures which may be regarded as a component of phase detector 30 for convenience.

It is understood that Fourier transformer 32 may, in practice, act upon a stored (in storage unit 34) representation of the phase resolved data. This reflects the common practice of averaging a number of time domain phase resolved waveforms to enhance the signal-to-noise ratio. The transformation function is then applied to the resultant averaged waveform. Display device 36 operates on the acquired data to present same for inspection. Controller 38, most often comprising one or more computers, controls and correlates the operation of the entire apparatus.

Turning now to FIG. 2a, there is shown a typical saddle coil resonator 40 of the prior art, here comprising two parallel current loops. FIG. 2b shows the same prior art coil with an RF shield 42 as practiced in the prior art. Such saddle coil 40 contains an RF shield 42 at one (or both) end(s) thereof. Such prior art is embodied in U.S. Pat. No. 5,192,911 by way of example. The RF shield 42, (intended by prior art primarily to provide RF shielding to the sample from radiation emanating from the coil terminals and to shield the circuit from the effects of conductive samples), furnished additional distributed parallel capacitance to the inductor, in this case, saddle coil 40. Slots 41c, d together with windows 46a and 46b define the saddle coil geometry. The prior art embodied the RF shield as a cylindrical segment coaxially disposed with the coil and axially placed well separated from the boundary 44 of the window 46a of saddle coil 40 in close proximity to the coil terminals 49a and 49b. This axial placement limitation was conventionally judged to be necessary to avoid distortion of both the $B_0$ (polarizing) magnetic field and the RF magnetic field, $B_1$, due to the RF coil. The tuning and matching function is suggested by the representative network 80 connected at terminals 72a,b. The present invention extends the capacitor band structure of prior art to substantially coincide with the projected outline of the saddle coil, or equivalent resonator, or as much of such projection as might result in improved performance of the resonator.

Figure 3A:
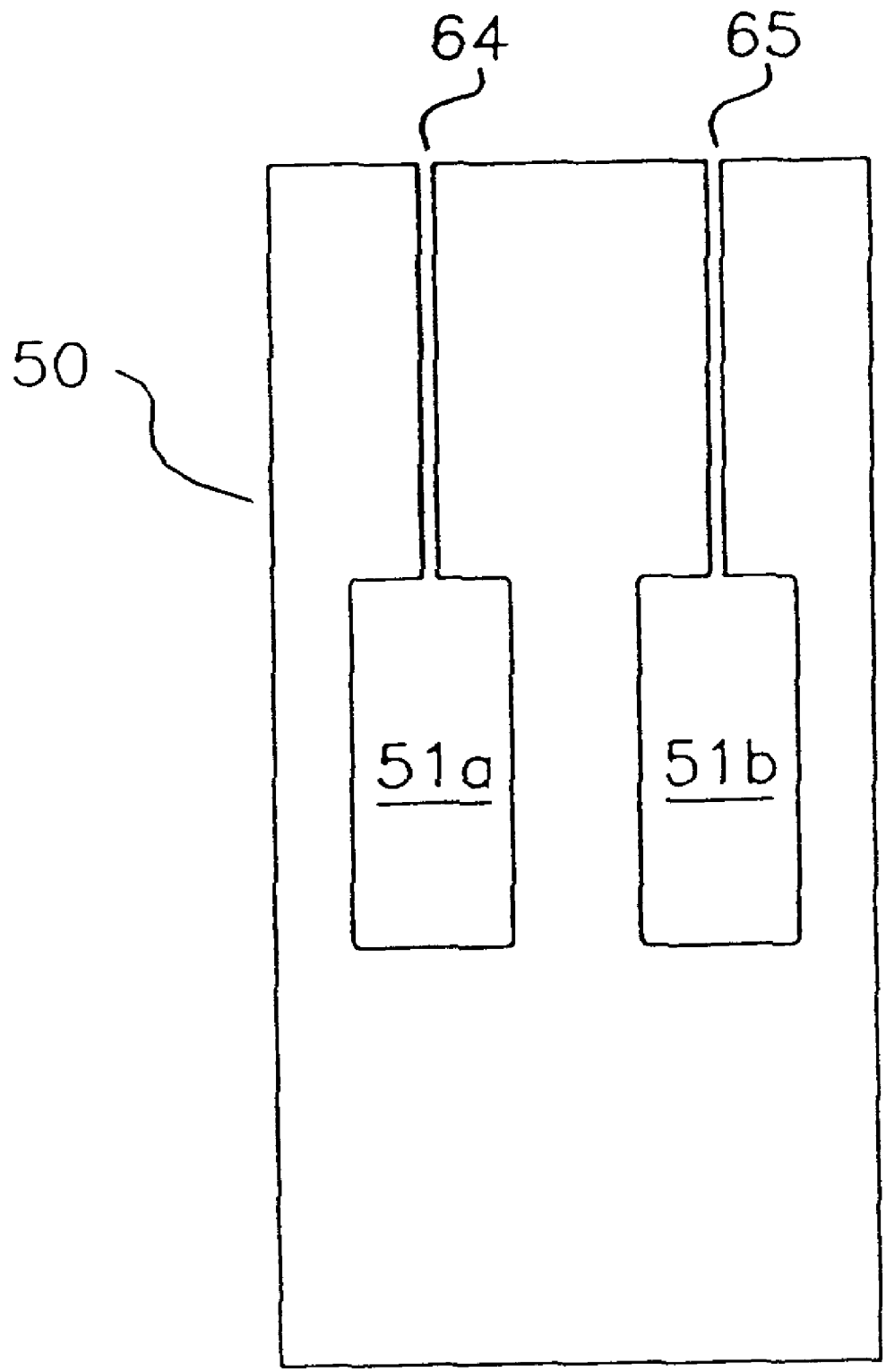
FIG. 3a shows a capacitor band of the present invention mapped onto a plane
Figure 3B:
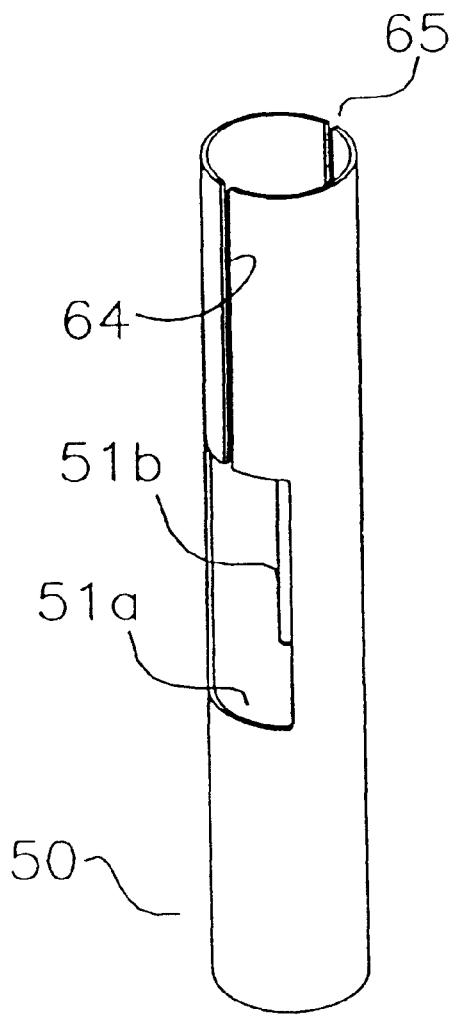
FIG. 3b shows a capacitor band of the present invention in right cylindrical form.

Turning now to FIG. 3a there is shown a shaped capacitor band 50 of the present invention as mapped onto a plane and in FIG. 3b the inventive capacitor band 50 is shown in its 3 dimensional perspective. It is understood that in use the capacitor band is rolled into a form which is coaxial with the underlying (or overlying) coil which may be taken as the coil 40, for convenience of description. While the coil and capacitor band is ordinarily of right cylindrical symmetry, elliptical symmetry may be appropriate for certain applications. Capacitor band 50 has windows 51a and 51b which correspond to the windows 46a and 46b of the saddle coil. The windows of the capacitor band and coil may be closely congruent, or the capacitor band window dimensions may be selected to exhibit somewhat greater dimensions such that the limiting aperture is defined by the coil windows. Slots 64 and 65 serve to interrupt circulating currents around the windows 51a and 51b on the surface of the capacitor band 50. Such circulating surface currents would short circuit the saddle coil or severely degrade performance. The slots 64 and 65 are preferably positioned at the midpoint of windows 51a and 51b, opposite the slots 41c and 41d which define the terminals of the saddle coil 40. The position or angular orientation of the slots 64 and 65 may be placed elsewhere as discussed below. The critical purpose served by these slots in the floating capacitor band structure is to control induced circulating currents on the capacitor band which essentially mirror the circulating currents through the underlying coil loops. Control, in this context, may range from a substantially complete interruption of the circulating current to any finite current which may be desired for design purposes. The shaped capacitor band of the present invention is preferably electrically floating; however, in suitable situations it may prove desirable to connect the capacitor band to a selected potential, such as a null point or a terminal.

Figure 3C:
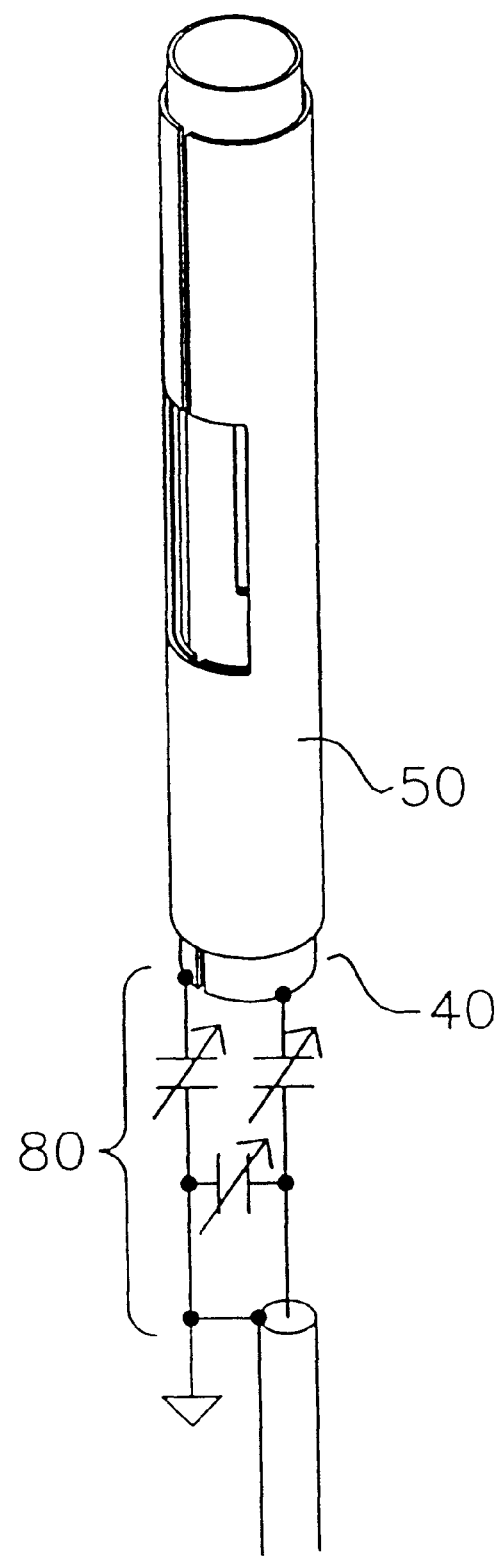
FIG. 3c shows the assembly of FIGS. 3a and 3b.

FIG. 3c shows the assembled coil and capacitor band arrangement. Where desired, the capacitance is further adjustable (lowered) by constraining the axial extent of the capacitor band. The capacitance may be increased by addition of a dielectric medium between the capacitor band and the coil (not shown). The dielectric may be selected as to dielectric constant and/or thickness to obtain desired resonant properties. For example, air ($\epsilon/\epsilon_0$=1.0), PTFE ($\epsilon/\epsilon_0$=2.1), quartz ($\epsilon/\epsilon_0$=4.2), Pyrex ($\epsilon/\epsilon_0$ about 5), and alumina ($\epsilon/\epsilon_0$ about 8) are common choices of dielectric for insertion between capacitor band and RF coil.

Figure 3D:
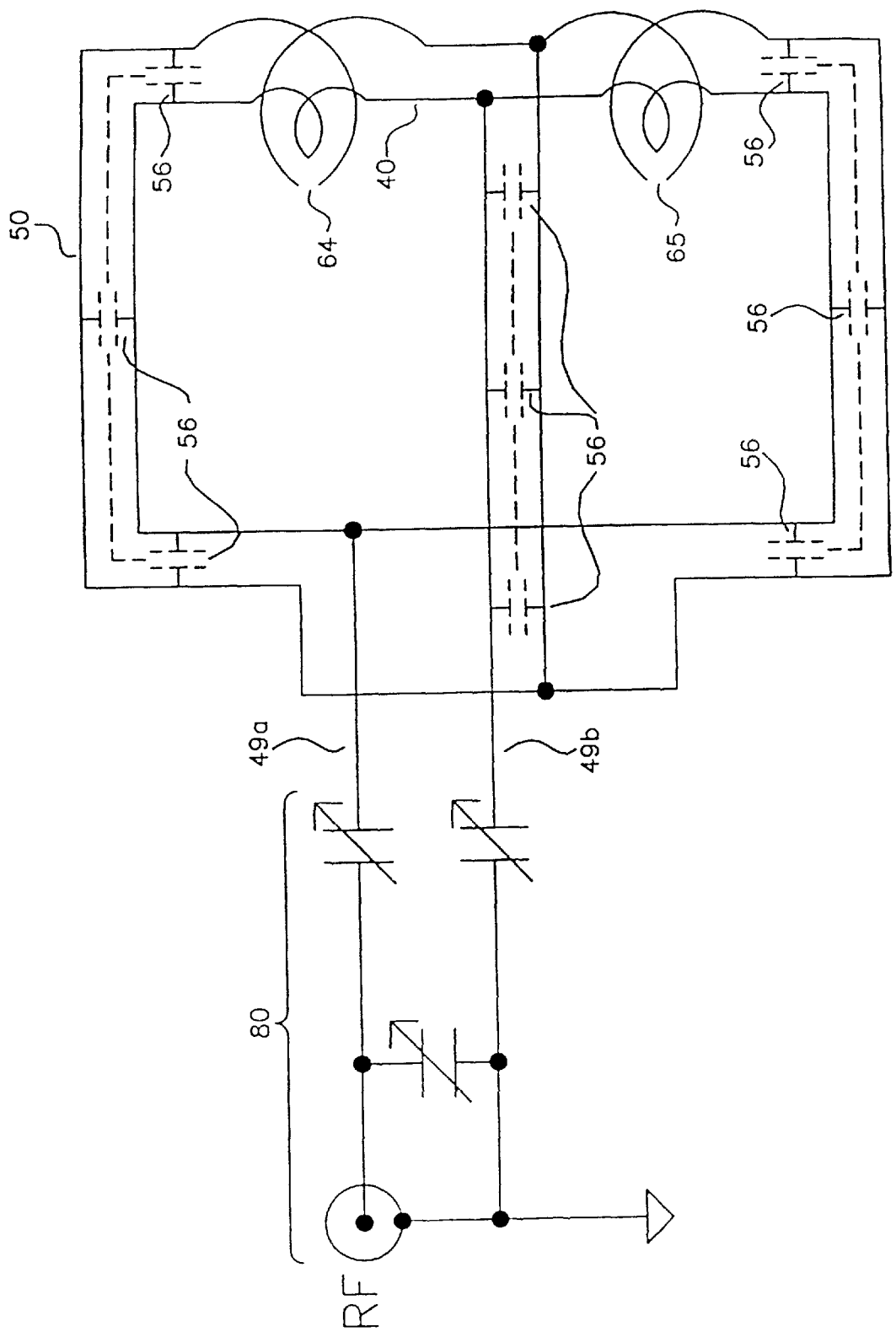
FIG. 3d is an equivalent schematic of the parallel saddle resonator and capacitor band.

An equivalent circuit is indicated in FIG. 3d for a typical parallel saddle coil resonator and capacitor band. The capacitor band supplies a distributed parallel capacitance 56 to the resonator which is easily designed by choice of dimensions and/or dielectric. Further capacitance between terminals 49a and 49b may be established by discrete chip capacitors, or by designed coupling between the terminal members.

Figure 4A:
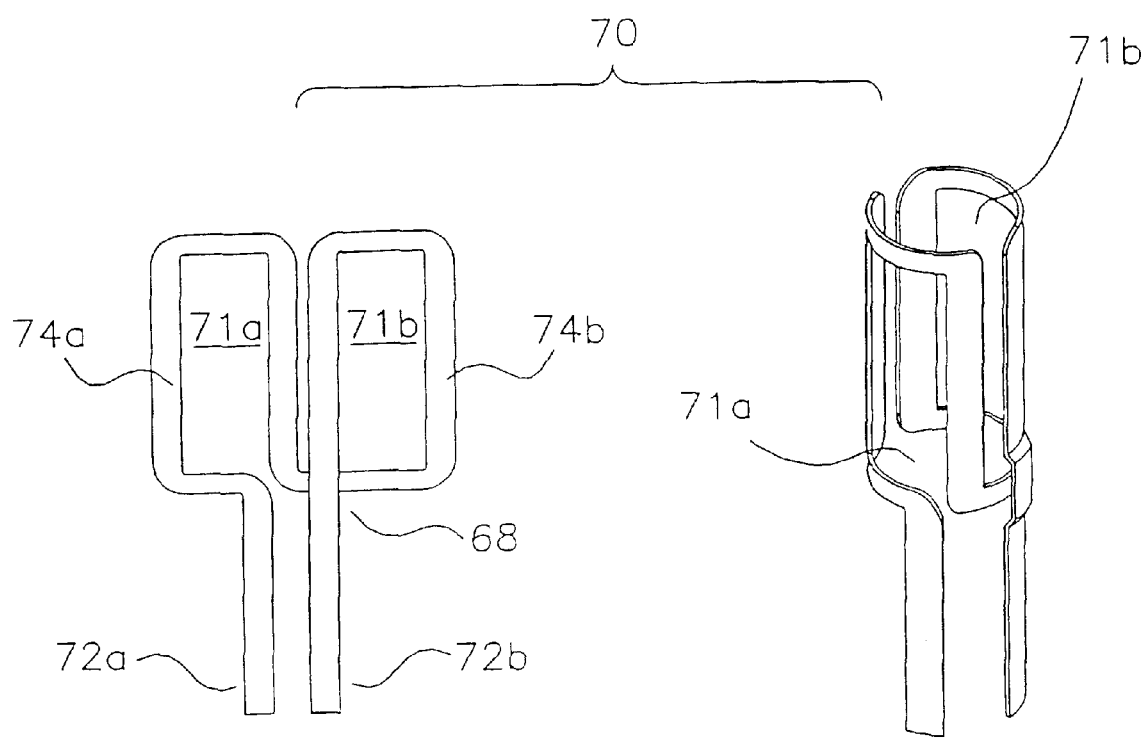
FIG. 4a shows a serial coil in both planar and cylindrical form.
Figure 4B:
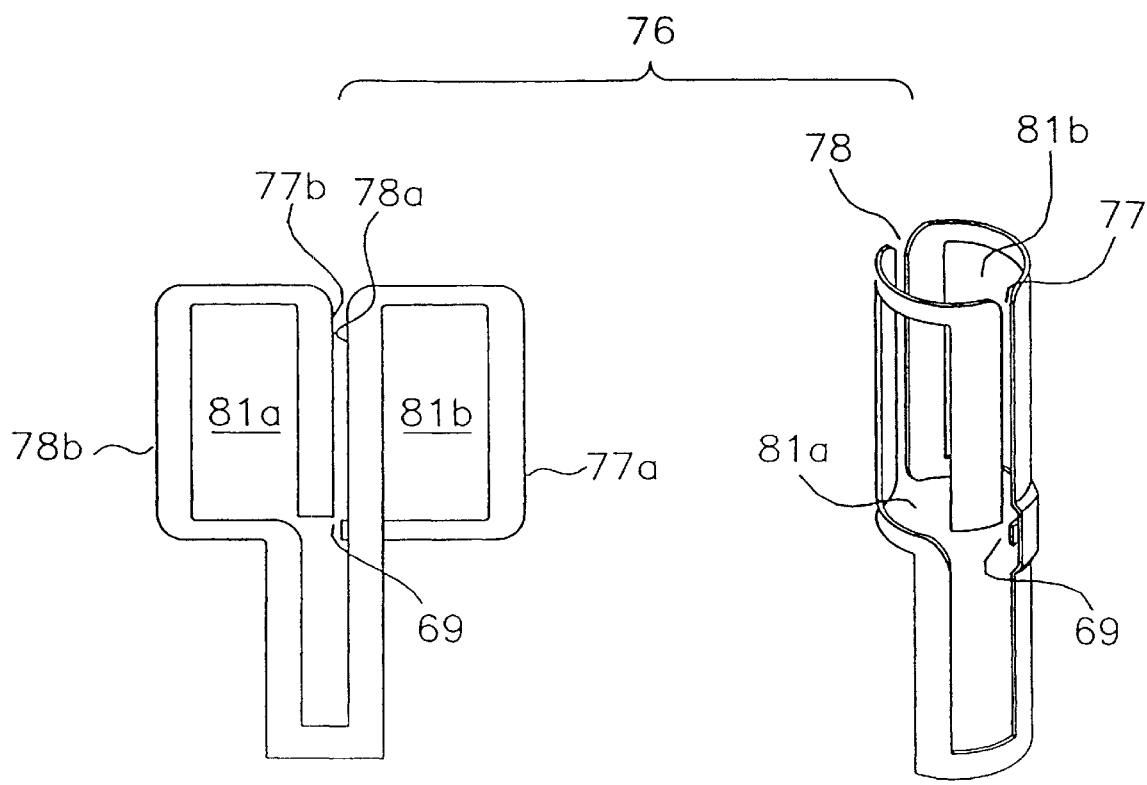
Figure 4C:
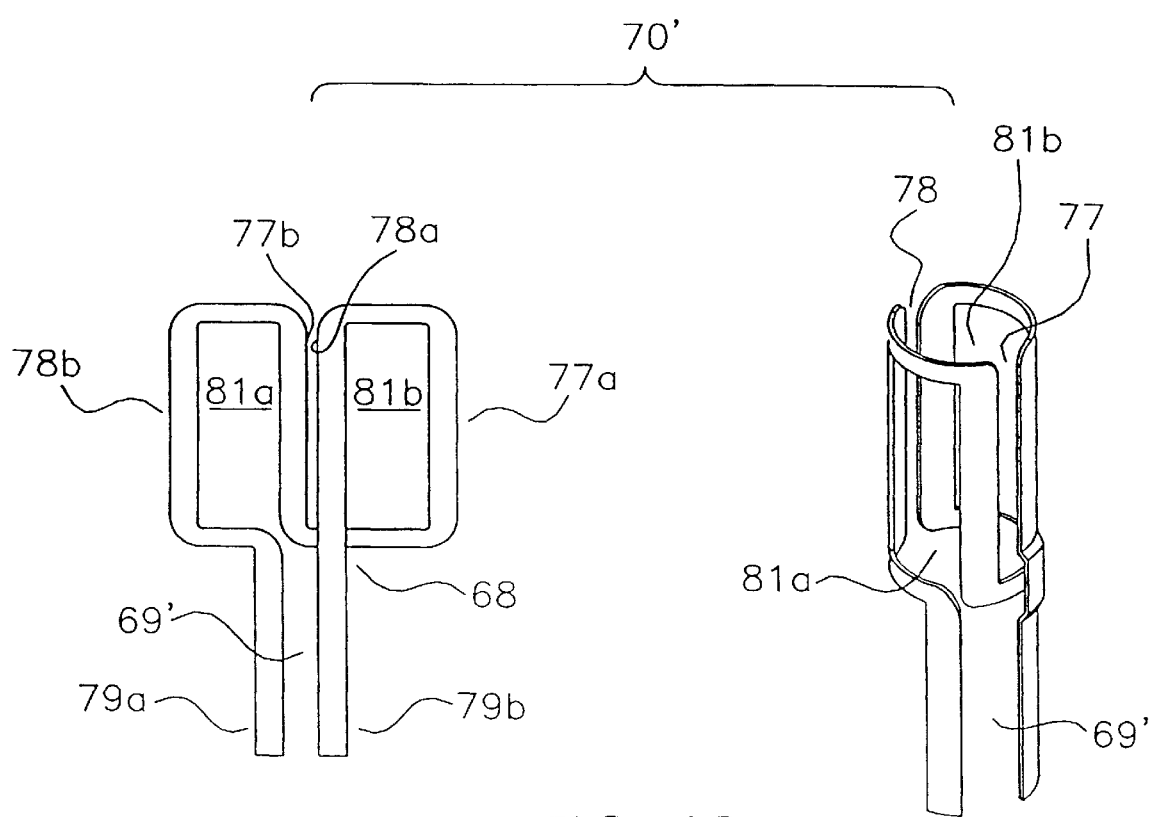
FIG. 4c illustrates an alternative design to FIG. 4b.
Figure 4D:
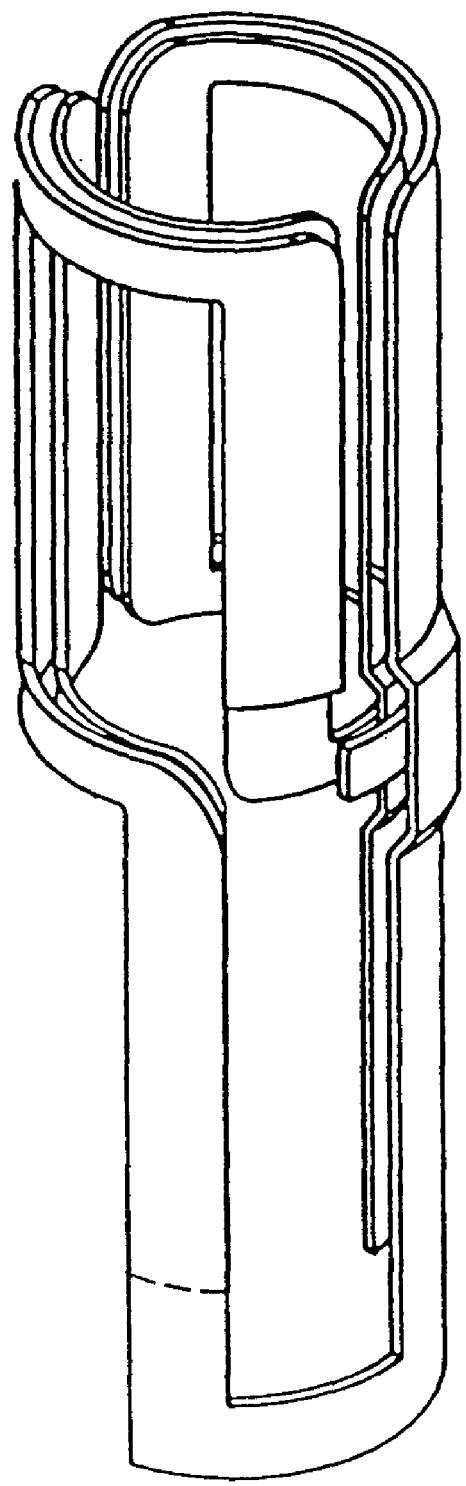
FIG. 4d shows an serial coil/capacitor band assembly.

Another embodiment of the invention directed to a serial saddle coil, similar to that of the parallel saddle coil. For specificity, consider two single loops in series. FIG. 4a shows a typical serial saddle coil 70 mapped to substantially planar form. The serial coil 70 is not precisely capable of such mapping in the topological sense because there is a "crossover" portion 68 of the series connection between the serially adjacent current loops. This crossover conductor requires electrical isolation from the underlying portion of the loop, as by an insulating layer. This serial coil defines two respective RF windows 71a and 71b within the respective current loops 74a and 74b. Terminals 72a and 72b are coupled through a network to the RF system as above described. FIG. 4b shows one capacitor band 76 of the present invention wherein the gap 69 is located to be proximal to the crossover portion 68 of the coil 70. Windows 81a,b (and optional auxiliary windows 77 and 78 ) are defined by portions 77a,b and 78a,b of the capacitor band. Another embodiment of the inventive capacitor band places the gap 69' proximate to the terminals 72a, 72b of the coil 70 as shown in FIG. 4c. An assembly of the coil and capacitor band of FIGS. 4a and 4b is shown in FIG. 4d. Note that the leg portions 79a, 79b do not couple by direct connection to any circuit and that the capacitor bands 76 and 70' are electrically floating.

Figure 5A:
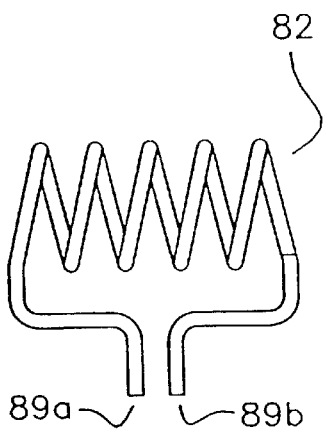
FIG. 5a is a helical coil for use in an NMR probe.
Figure 5B:
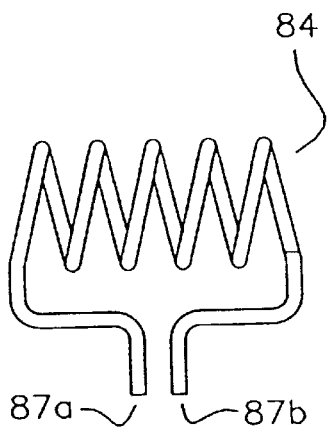
Figure 5C:
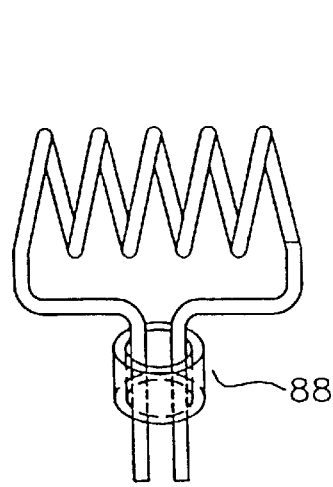
FIG. 5c shows a limited capacitor band suitable for use with a helical coil.
Figure 5D:
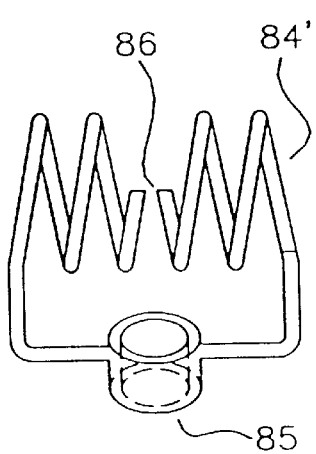
Figure 5E:
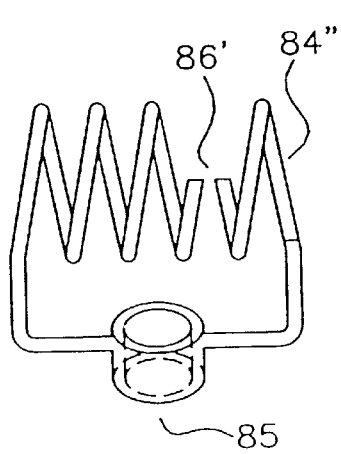
FIG. 5e is a variation of the capacitor band of FIG. 5d.
Figure 5F:
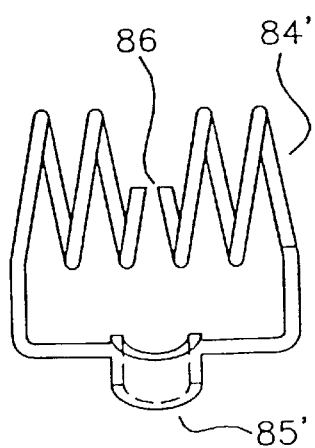
FIG. 5f is another variation of the capacitor band of FIG. 5d.

FIG. 5b illustrates a capacitor band 84 of the present invention for use with a helical coil of comparable shape and dimension (shown in FIG. 5a), having terminals 87a,b which are proximate to coil terminals 89a,b and insulated from the coil by a suitable dielectric. Capacitor band terminals 87a,b define a gap corresponding to the location of coil terminals 89a,b in an arrangement similar to the location of the gap 69' of the capacitor band for the serial saddle coil illustrated in FIG. 4c. FIG. 5c shows a helical coil of FIG. 5a equipped with a limited floating capacitor band. The capacitor band 84' of FIG. 5d is similar to the arrangement of FIG. 4b, except that the gap 86 is located at a position intermediate to the coil terminals and the coil terminals 89a,b of coil structure 82 are surrounded by a portion 85 of the capacitor band 84' in analogy with the structure shown in FIGS. 4b,d. FIG. 5e is a variation of the helical capacitor band for testing the efficacy of the position of the gap 86, 86' in the capacitor band. FIG. 5f is a variation of FIG. 5b with a slotted lower region 85'.

Figure 6:
FIG. 6 shows a capacitor band suitable for use with a 16 element birdcage coil.

FIG. 6 is a capacitor band having N legs for use with a coil of birdcage geometry having at least N legs separated by gaps therebetween. The legs of the underlying birdcage coil (not shown) may be regarded as providing a multiplicity of possible mesh currents, each of which is capable of inducing a mirror current in a proximate conducting structure. The floating (and/or non-floating) capacitor band of the present invention requires introduction of gaps in the capacitor band which prevent closure of each corresponding induced current. A variation on this approach is evident in FIG. 9b where both proximal and distal ends of the (birdcage) coil are surrounded by a continuous conducting members with only a single conducting path between cylindrical members.

The capacitor band of the present invention may be employed either outside of the coil or surrounded by the coil. In the latter configuration, one expects the capacitor band to shield portions of the interior volume of the coil from RF electric fields. In this use, the improved capacitor band serves the shielding function without severely reduced quality factor (Q) as described below. However, a capacitor band which is disposed outside the coil, also serves to provide a shielding mechanism for the interior volume, as evidenced by the performance described below.

In appropriate circumstances, floating capacitor bands of the present invention may be supported both internal and external to the coil 40. In those instances, it may be desired to interpose a selected dielectric(s) between coil and capacitor band.

Figure 7:
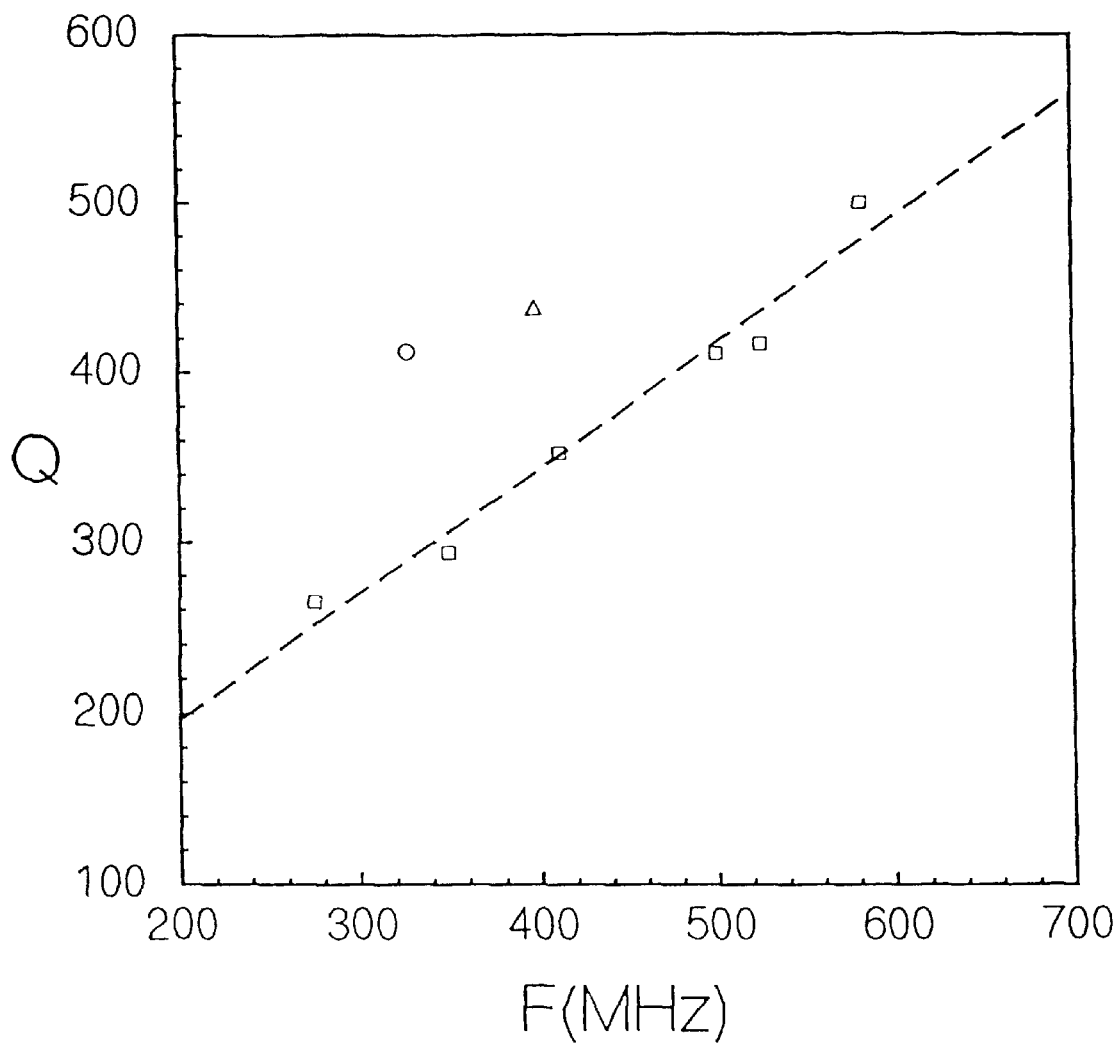
FIG. 7 shows the measured Q values resulting from a number of capacitor band arrangements for saddle coil geometry.

This extended capacitor band of the present invention clearly provides additional (distributed) capacitance and/or RF shielding and the resulting resonator shows an unexpected minimal diminishment in Q for the capacitor band resonator assembly of the present invention, as may be observed with the aid of FIG. 7. The unloaded Q for a standard shielded resonant assembly with an RF coil 13 mm in length (1-turn parallel saddle coil) and diameter sufficient for use with 3.4 mm id cylindrical sample tubes was investigated for a variety of progressively greater chip capacitors connected in symmetric pairs across the coil terminals 72a,b in standard fashion (including a no-chip datum). All data were obtained for constant diameter components using dielectric thicknesses of 0.01 inches. The RF coil is supported on the outer surface of a dielectric tube with standard RF shields mounted on the interior of the tube. In addition, capacitance was added to no-chip inserts using capacitor bands (see FIG. 3a) mounted on the exterior surface of a dielectric tube 11% larger in diameter than the tube on which the RF coil is mounted. This outer tube has a wall thickness (dielectric thickness) of 0.01 inches, and is coaxial with the inner tube. The Q value is obtained for these arrangements, including the coil with no added capacitance. Another arrangement for comparison comprises two coaxially disposed floating cylinders with a single conducting connector proximate to one of the axial members of the underlying parallel saddle coil. (See FIG. 9a). This embodiment, denoted A and so symbolized in FIGS. 7 and 8, differs from the preferred embodiment in that azimuthal symmetry is lost: only one of the axial members of the underlying saddle coil is mirrored by this embodiment of the inventive capacitor band. Such loss of azimuthal symmetry is offset by achievement of axial symmetry.

Measurement of Q for the coil/capacitor band assembly is obtained in conventional fashion from a Hewlett-Packard Network Analyzer. In such an arrangement, the Q is obtained as the ratio of the self resonance frequency of the assembly to its bandwidth.

As capacitance is increased by the addition of various value chip capacitors across the terminals 49a, 49b of the RF coil, the resonant frequency is reduced and the Q is likewise lowered. (The highest frequency corresponds to the residual capacitance between those terminals.) These data are represented by open squares and fitted to a straight line. The result for the preferred capacitor band of the present invention (open circle) surprisingly exhibits higher Q than would be expected from the progression of measurements with conventional chip capacitances. The Q of the inventive probe is about 58% higher than is the case for the same coil assembly where the chip capacitor measurement is carefully selected to furnish the same total capacitance as for the inventive capacitor band. The capacitor band of the present invention presents a significantly greater area than with the limited extent of RF shield structures to be found in such prior art as U.S. Pat. No. 5,192,911 and the capacitance contributed is evident in the reduction of the self resonant frequency. The measured Q is clearly not linearly related to the mere increase in the capacitance related to the succession of chip capacitor measurements. In large part this is believed due to the presence of the inventive capacitor band in close proximity to the locus of substantial current density on the RF coil.

The difference in Q may partly be ascribed to the different dielectrics and different RF field distributions for these data points; however, independent measurements were taken by observation of NMR pulse widths for achieving 90° spin flips. These data are consistent with the data of FIGS. 7 and 8.

Figure 8:
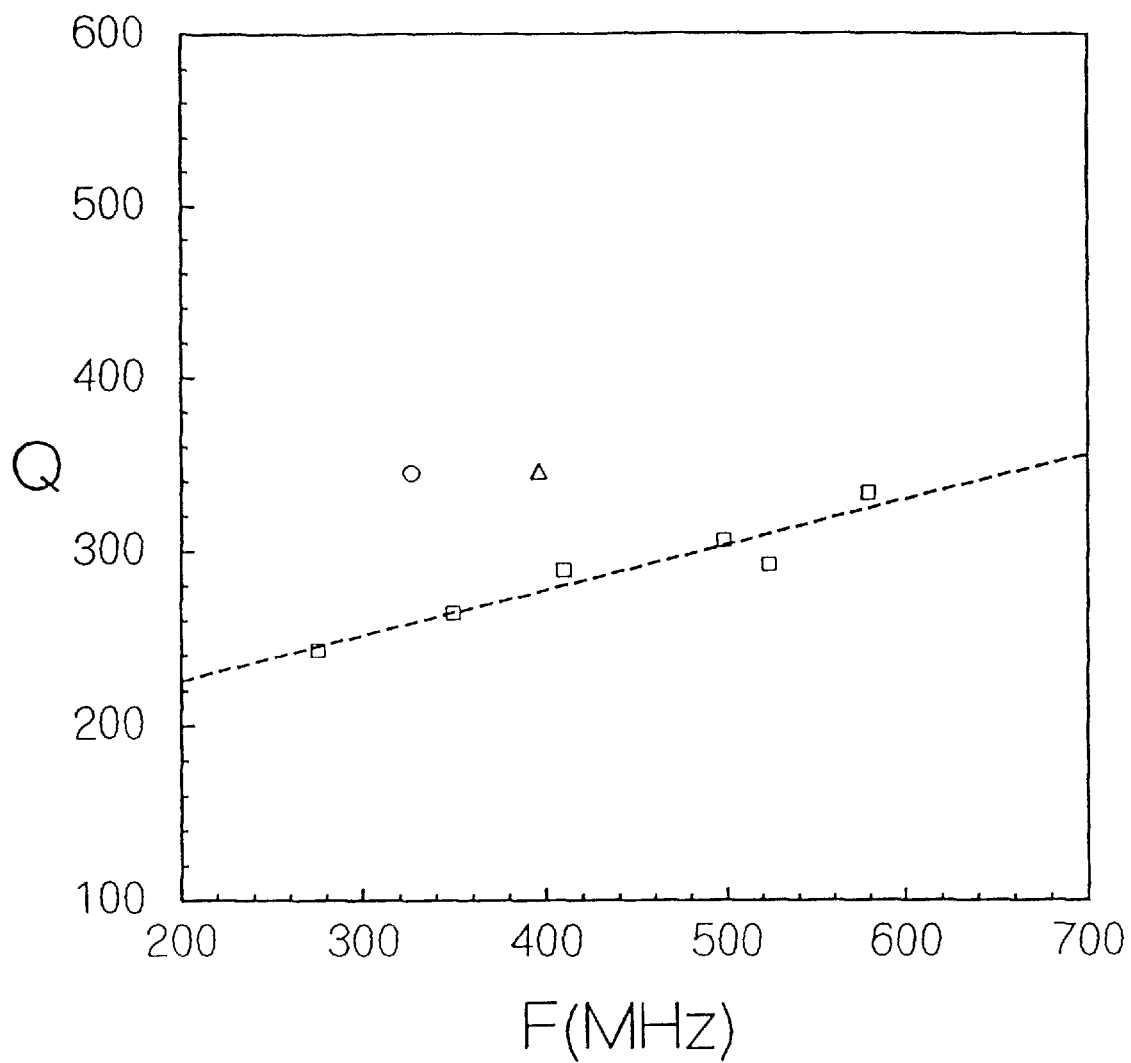
FIG. 8 shows measured Q values similar to FIG. 6 for 0.25 M NaCl sample.

FIG. 8 is similar to the data of FIG. 7 with the additional aspect that the coil is now loaded with a 3.4 mm id sample tube containing a 0.25M aqueous solution of NaCl. Salts typically degrade the Q of an NMR resonator due to the RF electric field and the polarizibility of the solution. While the effect of the salt solution lowers the Q of the improved capacitor banded probe, the present invention again exhibits a Q which is strikingly higher than is the case for the same coil equipped with capacitance of prior art where the coil is loaded with a salt solution. With 0.25M NaCl, the Q of the inventive probe is about 36% higher than is the case for the same coil assembly where the chip capacitor measurement is carefully selected to furnish the same total capacitance as for the inventive capacitor band. The result implies an improved signal-to-noise ratio of about 17%.

Apart from the results displayed in FIGS. 7 and 8 (for insert assemblies having 13 mm length RF coils and of diameter sufficient for use with 3.4 mm id sample tubes), additional more sensitive measurements were obtained for smaller diameter inserts having 13 mm length RF coils with diameters sufficient for use with 2.4 mm id sample tubes. These inserts were installed into identical NMR probes with RF tuning and matching networks similar to the prior art network 80 shown in FIGS. 2a,b. With this arrangement, both network analyzer and NMR pulse width measurements (for achieving 90° spin flips) were made at the lower, desired resonant frequencies (in this case, 400 MHz. Representative data are summarized in Table 1.

TABLE 1

| | Inventive Capacitor Band | | Prior Art | |
|---|---|---|---|---|
| | unloaded | .25 M NaCl | unloaded | .25 M NaCl |
| resonant freq. MHz | 400.0 (no sample) | 399.25 | 400.0 (no sample) | 399.0 |
| Q (50 Ω) | 171 | 147 | 126 | 104 |
| Pw (90°) μsec @ constant | 2.95 | 3.20 | 3.50 | 3.95 |

TABLE 1-continued

| | Inventive Capacitor Band | | Prior Art | |
|---|---|---|---|---|
| | unloaded | .25 M NaCl | unloaded | .25 M NaCl |
| transmitter power | | | | |

The resonant frequencies in Table 1 were measured with a network analyzer, both without any sample (empty) and with aqueous 0.25 M NaCl sample. Frequencies were measured without readjustment of the tuning and matching network of the probe between samples, thereby showing the frequency shift due to sample dielectric constant. The probe Q-values and pulse widths, listed in Table 1 were measured with the tuning and matching network adjusted to 50 ohms for each sample in the conventional manner.

Whereas the network analyzer measurements yield gross electrical parameters characterizing an insert, measurements of the NMR performance are related to a sample disposed on the axis of the insert and thus the difference in performance in respect to prior art is indicative of the field distribution proximate that axis. Whereas the test chip capacitor assembly exhibits a 17.5% degradation in Q for lossy samples, for the inventive capacitor band the corresponding reduction in Q is about 14.0%. The NMR pulse width variation roughly corresponds to the square root of Q. The more favorable result (higher achievable Q) under load for the present invention is believed to be found in the selective reduction of that electric field component arising from voltage drops around the coil owing to the RF signal applied to the coil terminals, as compared to the induced RF electric field. Note that the above measurements are for capacitor bands external to the coil. In a functional sense, the internal sample volume is "shielded" by the external capacitor band. This observation is consistent with the expected distortion by the capacitor band, of the electric field distribution due to the voltage drop along the coil.

A very practical consequence of the improved behavior under load is the reduced frequency variation between loaded and unloaded resonators. This implies very small frequency variation between different samples and a correspondingly reduced need to re-tune from sample to sample.

Measurements of a similar nature have been made for an RF resonator comprising a helical coil similar to FIG. 5a and shaped capacitor bands similar to FIGS. 5d,e,f, and limited capacitor band similar to FIG. 5c". The diameter of the coil was 0.206 inch and the length was 0.5 inch. The conductor was a ribbon of 0.04 inch width and insulated with PTFE from the capacitor band. Performance has been compared between a bare coil, a coil with limited capacitor band and a coil with an extended capacitor band. The limited capacitor band 88 is analogous to the saddle coil of prior art with capacitance realized using the RF shield 42 surrounding the terminal region of the helical coil. The extended capacitor band, following the present invention, was examined for three different locii of the current controlling gap. Observations were made for a coil capacitor assembly having a (a) limited capacitor band 88 and for an extended capacitor band including a gap in the capacitor band disposed (b) proximate the coil terminals 87a, 87b in FIG. 5b; (c) proximate the mid-point of the coil 86 in FIG. 5d; and (d) proximate a position removed about one turn from the mid-point of the coil. The loaded sample comprised a 0.25M NaCl aqueous solution contained within a 3.4 mm id Pyrex tube disposed colinear with the axis of the helix.

TABLE 2

|     | Unloaded | | Loaded (0.25M NaCl) | |
| --- | --- | --- | --- | --- |
|     | Resonant Freq. | Q | Resonant Freq. | Q |
| (a) | 470 MHz | 410 5% | 455 | 58 5% |
| (b) | 471 | 380 | 454 | 50 |
| (c) | 313.2 | 366 | 310 | 161 |
| (d) | 317.9 | 352 | 314 | 123 |

The data (a) above correspond to the limited capacitor band arrangement 88 of FIG. 5*c*. The data (b) correspond to the shaped capacitor band of FIG. 5*b*. The data (c) correspond to the shaped capacitor band of FIG. 5*d*. The data (d) correspond to the shaped capacitor band of FIG. 5*e*.

These data demonstrate the minimally degraded Q for the extended capacitor band in like manner to the case for saddle coils. Further, the measurement under load is likewise notable for the embodiments where the gap is located near mid-coil compared to proximity to the terminal regions. This is probably related to the fact that the terminal regions of a helical coil are remote from the sample region and the capacitor band in this region has little effect upon the field distribution in the sample volume. In particular, the symmetrically placed gap results in minimal frequency deviation from loading.

The problem of electric fields arising from voltage drops across coil terminals and separately from induced electric fields has been considered for a number of quite distinct applications (plasma torches, etc) and the topic was reviewed by Contaxes and Hatch, J. Appl. Phys., v.40, p.3548–3550 (1969). In the present instance, it is believed that the floating capacitor band of the present invention (generally) reduces the electric field arising from the voltage gradient over the coil when the capacitor band is disposed outside the coil and serves a shielding function when disposed inside the diameter of the coil. The application of the present invention thus extends to instances where the field distribution of an inductor is critical apart from the gross inductance value. One such application is that of the inductive coupled plasma torch. Another general area of application is the realization of a high Q resonator where geometric constraints are paramount, as is the case for circuit miniaturization.

As was found with saddle coil geometries, the self resonant frequency is also observed to be more nearly independent of the salt sample loading for the present invention compared to the prior art.

Another advantage of the present capacitor band is found in the greater degree of geometric symmetry in comparison with the prior art. For application in high resolution NMR applications, the more symmetric structure of the present invention introduces fewer and/or lesser distortions of the static magnetic field. Thus, less effort is expended in shimming corrections to the static magnetic field on account of the material introduced by the capacitor band.

Figure 9A:
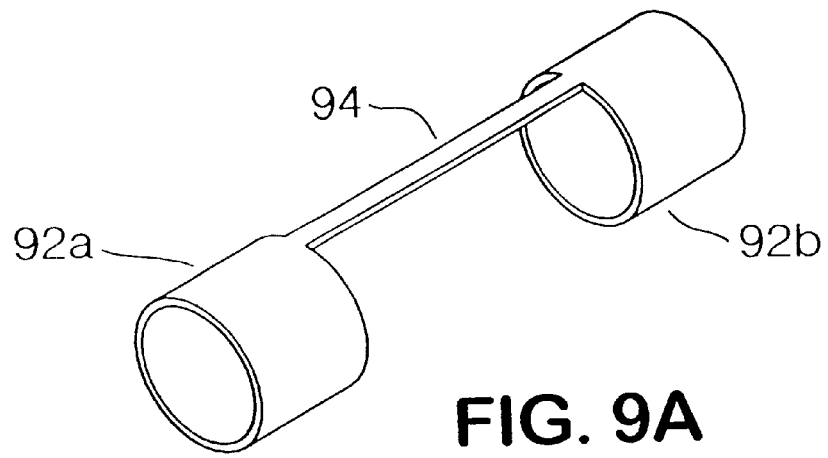
FIG. 9a is a general capacitor band.
Figure 9B:
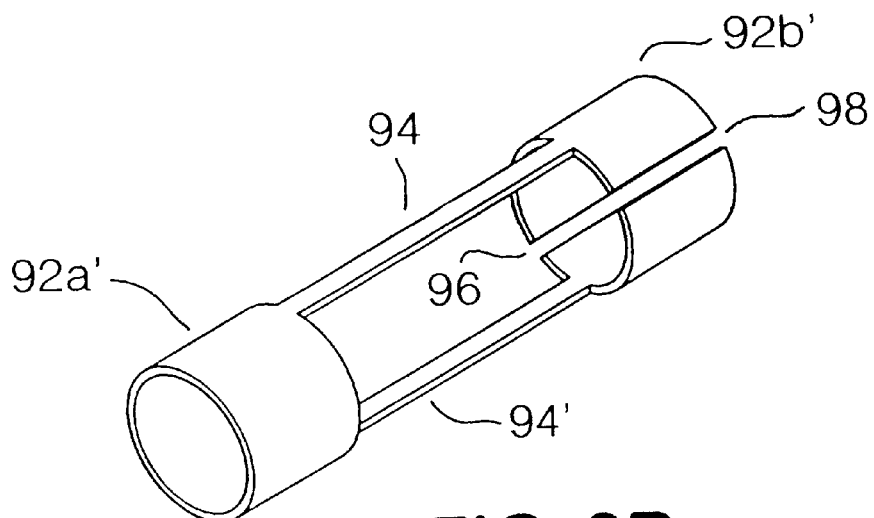
FIG. 9b is another capacitor band arrangement.
Figure 9C:
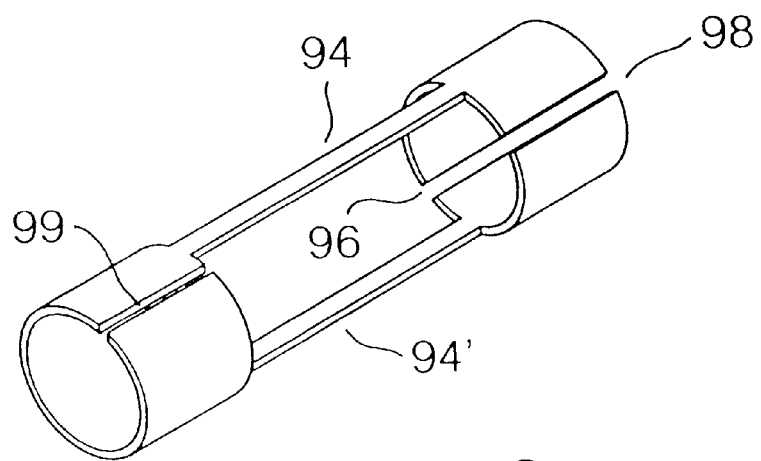
FIG. 9c is an alternative topology to that of FIG. 9b.
Figure 10A:
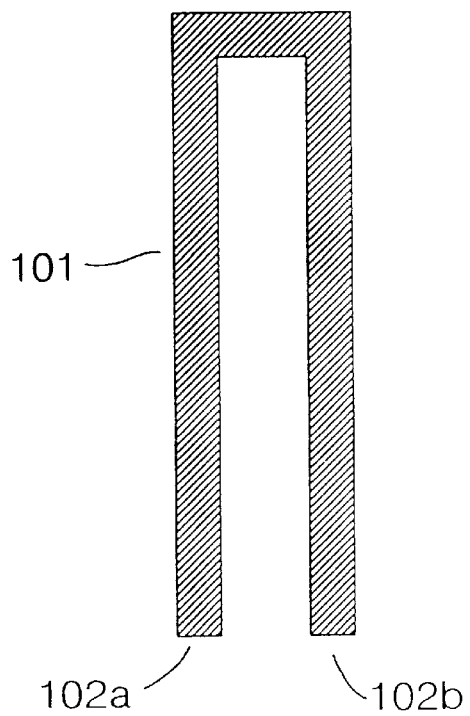
FIG. 10a is a representative inductive member in the form of a planar loop.
Figure 10B:
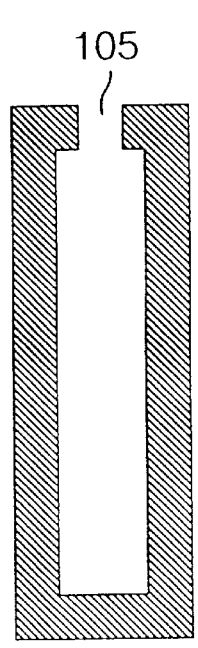
Figure 10C:
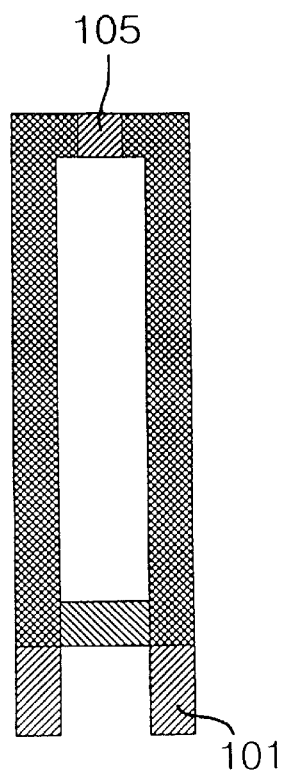
FIG. 10c is a top view of an example of the invention in an integrated circuit structure.
Figure 10D:
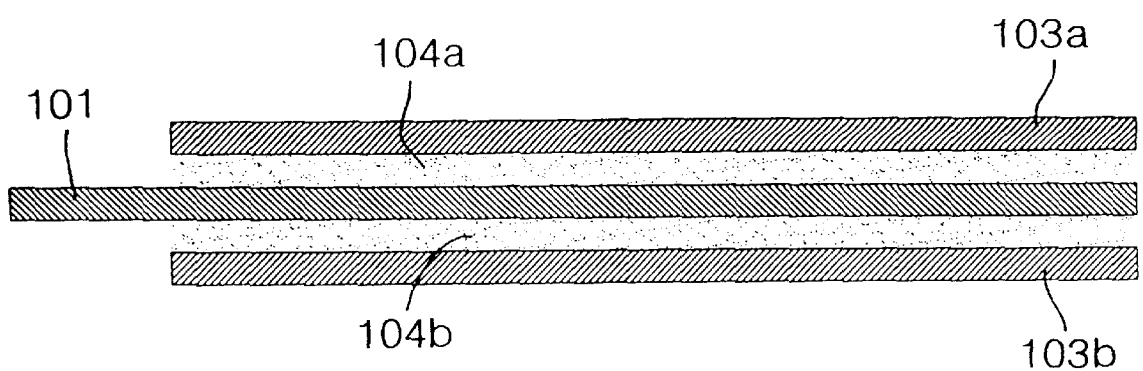
FIG. 10d is a side view of an example of the invention in an integrated circuit structure.

With the aid of FIGS. 9*a–c*, consider an abstraction of the capacitor band in the form of two cylindrical portions 92*a,b* and 92*a',b'* which are coaxial with a general inductive component not shown, an RF coil of selected geometry, for example. While the cylindrical portions may be disposed either inside or outside of the coil, (or one inside and one outside), for simplicity consider the arrangement where the two cylindrical portions surround respective axial portions of the inductive component. It is a premise that the inductive component has axial symmetry with a median plane transverse to the symmetry axis and that (preferably) the terminals both extend in the same direction from the median plane. In a preferred embodiment, a first cylindrical portion 92*a* or 92*a'* surrounds the terminal region of the inductor providing distributed capacitance across the terminals. This cylindrical portion is continuous in the electrical sense (whereas the other cylindrical portion 92*b* or 92*b'* might not be). The second cylindrical portion is spaced from the first and overlays a portion of the inductive component. The spaced apart cylindrical portions thus define an open region or window for the illumination of an object or sample within the interior volume of the inductive component. The two spaced apart, coaxial cylindrical portions are connected by at least one conductor 94 resulting in a single window of angular dimension equal to $2\pi$ minus the angular width of the connector. (This exact configuration corresponds to the points labeled "ΔA" in FIGS. 7 and 8.) Thus there is no complete circuit for an RF current between the two cylindrical portions (neglecting a small capacitive coupling across a narrow gap). Consider the addition of a second connector 94' (as in FIG. 9*b*) between the cylindrical portions (where there are no gaps 96 and 98) where the two connectors 94 and 94' define two windows, usually equal in area and symmetrically placed. Such an arrangement will prevent the functioning of the resonant circuit because the inductor is effectively shorted by the induced circulating current between the first and second cylindrical portions. If the second cylinder 92*b'* is altered by introduction of two insulating gaps 96 and 98 in the peripheral wall of thereof, each gap situated between respective connectors, there will be no completed current path between the first and second cylinders. In FIG. 9*c* a further gap 99 is introduced into the cylindrical portion 92*a* with the preference that such gap 99 not be aligned with a region of relatively intense current density in the associated general inductive member. Thus the nonconductive gaps are a necessary element of the shaped capacitor band of the present invention. The instance of a single connector between the cylindrical portions is simply an example of a non-conductive gap in respect of another connector. Indeed, additional connector(s), providing desired capacitive coupling to the coil, may each include a small gap to fulfill the requirement for prevention of circulating currents between first and second cylindrical portions, as long as one connector is provided between the first and second cylindrical portions. If desired, the gap may be dimensioned to allow a controlled RF coupling across the gap to optimize Q, or provide an additional adjustable parameter for tuning of the entire assembly.

The location of the gap is preferably proximate to locii of a voltage null when the underlying coil forms a balanced circuit component. Positioning the gap and the width of the gap are variables which permit fine adjustments of the coil performance. It is generally found that the exact position of the gap is not critical although preferences are expressed herein. Certain additional gaps are not prejudicial to performance. For example, the portion of the capacitor band proximate terminal members of the coil might contain a gap, with the proviso that such gap not be so azimuthally aligned with a terminal that the capacitive coupling therebetween is substantially diminished.

Although it is preferred for the leads to be proximate for an inductor for use with the inventive capacitor band, the present invention can accommodate terminals which are non-proximate by providing distributed capacitances proximate each terminal. These distributed capacitances are then tied together electrically while the capacitor band floats as described.

Consider again an inductive component which is further identified as comprising at least two series connected current loops. The respective capacitor band of the present invention will take the general form of two portions closely projecting the shape of the series loops with a direct connecting leg therebetween. Here again, the capacitor band of the present invention includes a gap between the two portions in the sense that there is no return current path via second leg. The location and size of the gap is further selectable to simplify the topological complexity of the serial arrangement if the gap is located and sized to accommodate the width of the crossover portion of the serial coil which the capacitor band is mirroring.

FIGS. 10a–d represent a schematic realization of the present invention in the context of integrated circuit structures. A representative inductive member 101 is formed as a conductive pattern in a layer on a substrate having terminals 102a,b (extending in the same direction, i.e substantially parallel and proximal). The capacitor band is realized from at least one electrically floating conductive layer(s) such as 103a,b separated from the inductive member 101 by dielectric layers 104a,b. One exemplary arrangement for a gap 105 is shown.

Although this invention has been described with reference to particular embodiments and examples, other modifications and variations will occur to those skilled in the art in view of the above teachings. It should be understood that, within the scope of the appended claims, this invention may be practiced otherwise than as specifically described.

What is claimed is:

1. An NMR probe comprising
   (a) an inductive component in combination with a capacitive component for establishing an RF resonant condition,
      said inductive component having a first and second terminal and a first geometric shape therebetween to define an RF current path from said first to said second terminal, said RF current path accommodating an RF current distribution substantially over a surface of said first geometric shape,
   (b) said capacitive component comprising a capacitor band, said capacitor band comprising a conductive sheet spaced from said inductive component and having a second geometric shape substantially congruent to the locus of a major portion of said RF current distribution,
      said second geometric shape comprising at least one non-conducting slot in said conducting sheet, said slot disposed in the projected region corresponding to the region between said first and second terminals.

2. The NMR probe of claim 1 wherein said second geometric shape is approximately congruent with said first geometric shape.

3. The NMR probe of claim 1 wherein said first shape comprises a saddle coil.

4. The NMR probe of claim 1 wherein said first shape comprises a helical coil.

5. The NMR probe of claim 2 wherein said inductive component and said capacitive component are coaxial.

6. The NMR probe of claim 2 wherein said capacitive component is electrically floating.

7. An NMR apparatus for investigation of the composition of an object, comprising
   (a) a magnet for establishing polarizing field of desired magnetic field distribution,
   (b) an RF energy source,
   (c) an RF resonance detector, and
   (d) an RF probe for selectively coupling said object to said RF energy source or said RF resonance detector, said probe comprising
      an inductive component in combination with a capacitive component for establishing an RF resonant condition,
      said inductive component having a first and second terminal and a first geometric shape therebetween to define an RF current path from said first to said second terminal, said RF current path accommodating an RF current distribution substantially over a surface of said first geometric shape,
      said capacitive component comprising a capacitor band, said capacitor band comprising a conductive sheet spaced from said inductive component and having a second geometric shape substantially congruent to the locus of a major portion of said RF current distribution,
      said second geometric shape comprising at least one non-conducting slot in said conducting sheet, said slot disposed in the projected region corresponding to the region between said first and second terminals.

8. An NMR probe comprising
   an inductive element having a first axis, a median plane transverse to said first axis, and at least two terminals extending in the same direction from said median plane, a first conductive cylindrical portion disposed coaxially with said first axis and having a distal edge projecting on a proximal portion of said inductive component, including said terminals,
   a second conductive cylindrical portion disposed coaxially with said first axis and having a proximal edge spaced from said distal edge of said first cylinder, said proximal edge projecting on a distal portion of said inductive component, whereby said proximal and distal edges define a window,
   at least one conducting connector between said first and second conductive cylindrical portions,
   said first and second conducting cylindrical portions adapted to control circulating current between said first and second cylindrical portions.

9. The NMR probe of claim 8 wherein control of circulating currents comprises reduction of said circulating current to substantially null current.

10. The NMR probe of claim 8 further comprising a dielectric cylinder portion disposed between said inductive component and any of said cylindrical portions or conducting connector(s) therebetween.

11. The NMR probe of claim 8 wherein a single conducting connector connects said first and said second cylindrical portion whereby a complete circuit is prevented between said first and said second cylindrical portions.

12. The NMR probe of claim 8 wherein N conducting connectors connect said cylindrical portions and at least one of said cylindrical portions includes N insulating gaps in the peripheral wall thereof, each said insulting gap arcuately situated between a pair of said N conducting connectors, whereby a complete circuit is avoided between said first and second cylindrical portions.

13. An NMR probe comprising
    an inductive element having first and second terminals and comprising a helical conductor having an axis and diameter D, pitch P, solenoid length L and conductor width W, and
    a capacitor band comprising another solenoidal conductor having a diameter D', pitch P, length substantially L and conductor width substantially W, said capacitor band disposed coaxially on said axis and spaced from said inductive element and further comprising a nonconductive interruption intermediate positions radially projected from said first and second terminals.

14. The NMR probe of claim 13 wherein said interruption occurs substantially near L/2.

15. The NMR probe of claim 13 wherein said diameter D'>D.

* * * * *